United States Patent
Kokame

(10) Patent No.: US 12,048,186 B2
(45) Date of Patent: Jul. 23, 2024

(54) DISPLAY DEVICE AND MANUFACTURING METHOD THEREOF

(71) Applicant: Japan Display Inc., Tokyo (JP)

(72) Inventor: Hiraaki Kokame, Tokyo (JP)

(73) Assignee: Japan Display Inc., Tokyo (JP)

(*) Notice: Subject to any disclaimer, the term of this patent is extended or adjusted under 35 U.S.C. 154(b) by 554 days.

(21) Appl. No.: 17/245,084

(22) Filed: Apr. 30, 2021

(65) Prior Publication Data
US 2021/0249631 A1    Aug. 12, 2021

Related U.S. Application Data

(63) Continuation of application No. PCT/JP2019/042365, filed on Oct. 29, 2019.

(30) Foreign Application Priority Data

Nov. 8, 2018  (JP) ................................ 2018-210428

(51) Int. Cl.
| | |
|---|---|
| *H10K 50/844* | (2023.01) |
| *H10K 59/122* | (2023.01) |
| *H10K 77/10* | (2023.01) |
| *H10K 102/00* | (2023.01) |

(52) U.S. Cl.
CPC ....... *H10K 50/844* (2023.02); *H10K 50/8445* (2023.02); *H10K 59/122* (2023.02); *H10K 77/111* (2023.02); *H10K 2102/311* (2023.02)

(58) Field of Classification Search
CPC .......................... H10K 50/844; H10K 50/8445
See application file for complete search history.

(56) References Cited

U.S. PATENT DOCUMENTS

| | | | |
|---|---|---|---|
| 2017/0244063 A1 | 8/2017 | Furuie | |
| 2018/0069195 A1 | 3/2018 | Furuie | |
| 2019/0326544 A1* | 10/2019 | Huang | ................... H10K 71/00 |

FOREIGN PATENT DOCUMENTS

| | | | |
|---|---|---|---|
| JP | 2017-147165 A | | 8/2017 |
| JP | 2019132962 A | * | 8/2019 |

OTHER PUBLICATIONS

International Search Report mailed on Jan. 21, 2020 for the PCT application No. PCT/JP2019/042365, with English machine translation.

* cited by examiner

*Primary Examiner* — Michele Fan
(74) *Attorney, Agent, or Firm* — Michael Best & Friedrich LLP

(57) ABSTRACT

A dam portion (200) includes a wall surface positioned along an edge of the organic film and faces the display area. The substantially rectangular shape is a rectangle including a side along a first direction and a side along a second direction perpendicular to the first direction and including a chamfered portion (210) forming an outline inclined to the first and second directions. The wall surface (200w) includes first partial wall surfaces (200x) along the first direction and second partial wall surfaces (200y) along the second direction. The first partial wall surfaces (200x) have a length that is an integer multiple of a first unit length, and the second partial wall surfaces (200y) have a length that is an integer multiple of a second unit length. In the chamfered portion (210), the first partial wall surfaces (200x) and the second partial wall surfaces (200y) are connected in a zigzag manner.

9 Claims, 5 Drawing Sheets

(c)

(b)

(a)

DISPLAY DEVICE AND MANUFACTURING METHOD THEREOF

CROSS-REFERENCE TO RELATED APPLICATION

The present application is Bypass Continuation of International Application No. PCT/JP2019/042365, filed on Oct. 29, 2019, which claims priority from Japanese Application No. JP2018-210428 filed on Nov. 8, 2018. The contents of these applications are hereby incorporated by reference into this application.

BACK GROUND OF THE INVENTION

1. Field of the Invention

The present invention relates to a display device and a manufacturing method of the display device.

2. Description of the Related Art

In recent years, organic EL display devices, which are display devices using organic electroluminescence (EL) element, have been put into practical use. The organic EL element is generally referred to as an OLED (organic light emitting diode). The organic materials constituting OLED are vulnerable to moisture, and thus, the organic EL display device may experience lighting failure such as dark spots caused by deterioration of the OLED due to moisture.

Further, in a liquid crystal display device, the characteristics of thin film transistors (TFT) are affected by moisture ingress and changed, resulting in deterioration of display quality.

To address this problem, JP2017-147165A discloses the display device that prevents deterioration of display quality by providing a flattening sealing film in the display area for sealing the display element. The flattening sealing film has a multilayer structure having a flattening layer made of a resin film sandwiched between sealing layers. Here, the resin film is formed by dropping a fluid resin by an ink jet method, for example, and curing the resin. At this time, a dam portion for blocking the resin is provided around the area where the resin is dropped.

FIG. 5 is a schematic partial plan view of a conventional display device, and shows a layout of a dam portion 2 and dropping positions (injection positions) 4 of resin by the ink jet method. An ink jet printer for forming a resin film on a substrate surface of the display device includes a mechanism for relatively moving an injection nozzle with respect to the substrate surface of the display device. When the x-direction and the y-direction are perpendicular to each other along the substrate surface, the mechanism can change the position of the nozzle in the x-direction and in the y-direction each at a predetermined pitch. That is, the dropping positions 4 of the resin with respect to the substrate surface are controlled as unit grids 6, which are two-dimensionally arranged at a predetermined pitch in the x-direction and in the y-direction, respectively.

SUMMARY OF THE INVENTION

A display area is basically a rectangle, or a shape close to a rectangle. Correspondingly, the planar shape of the flattening sealing film and the layout of the dam portion can be substantially rectangular, and the x-direction and the y-direction described above are basically arranged along sides 8 corresponding to the rectangle. As such, the grids 6 and the dam portion 2 are linearly arranged along the x-direction or the y-direction in a portion along the sides 8, and the distance between the grids 6 and the dam portion 2 is constant in such a portion.

The substantially rectangular shape includes a portion that is not rectangular (non-rectangular portion). In FIG. 5, an arc-shaped chamfered portion 10 at the corner of the rectangle is a non-rectangular portion. In the non-rectangular portion, the dam portion 2 is not along the x and y directions but inclined or curved, and not parallel to the arrangement of the grids 6 in the x and y directions. As a result, the distance between the outline of the two-dimensional arrangement of the grids 6 including the dropping positions 4 and the dam portion 2 is not constant in the non-rectangular portion, which makes it difficult to control the position of the end portion of the resin film. For example, a portion where the resin film does not reach the dam portion 2 or a portion protruding from the dam portion 2 is generated, and the function of the flattening sealing film is impaired in such portions. This may cause deterioration of display quality.

The present invention has been made in order to solve the above-mentioned problems, and it is an object of the present invention to easily control a position of an end portion of a resin film in a non-rectangular portion so as to prevent deterioration of display quality.

Solution to Problem (1) A display device according to the present invention includes a substrate including a display area in which a plurality of pixels are arranged, an organic film having a substantially rectangular planar shape and covering the display area; and a dam portion including a wall surface that is positioned along an edge of the organic film and faces the display area, wherein the substantially rectangular shape is a rectangle that includes a side along a first direction and a side along a second direction perpendicular to the first direction and includes a deformed portion forming an outline inclined to the first and second directions, the wall surface includes a plurality of first partial wall surfaces along the first direction and a plurality of second partial wall surfaces along the second direction, the plurality of first partial wall surfaces have a length that is an integer multiple of a first unit length, and the plurality of second partial wall surfaces have a length that is an integer multiple of a second unit length, and in the deformed portion of the substantially rectangular shape, the first partial wall surfaces and the second partial wall surfaces are connected in a zigzag manner.

(2) A manufacturing method of the display device according to the present invention includes dropping the organic film by an ink jet method to apply the organic film to the substrate, wherein the first unit length and the second unit length are respectively determined in accordance with a dropping pitch of ink jet in the first direction and a dropping pitch of ink jet in the second direction.

DETAILED DESCRIPTION OF THE INVENTION

Embodiments of the present invention will be described below in detail with reference to the accompanying drawings. In this regard, the present invention is not to be limited to the embodiments described below, and can be changed as appropriate without departing from the spirit of the invention.

The accompanying drawings may schematically illustrate widths, thicknesses, shapes, or other characteristics of each part for clarity of illustration, compared to actual configurations. However, such a schematic illustration is merely an example and not intended to limit the present invention. In this specification and the drawings, some elements identical or similar to those shown previously are denoted by the same reference signs as the previously shown elements, and thus repetitive detailed descriptions of them may be omitted as appropriate.

Further, in the detailed description of the present invention, when the relative position between a component and another component is defined, if not otherwise stated, the words "on" and "below" suggest not only a case where the another component is disposed immediately on or below the component, but also a case where the component is disposed on or below the another component with a third component interposed therebetween.

The embodiment described below features an organic EL display device. The organic EL display device is an active matrix type display device mounted on a TV, a personal computer, a portable terminal, and a mobile phone, for example.

A plurality of pixels constituting an image are two-dimensionally arranged in an image display area of the display device. In the description below, the xyz coordinate system, which is a three-dimensional orthogonal coordinate system, is used to set an x-axis and a y-axis to correspond to the two-dimensional orthogonal coordinate system corresponding to the image. For example, the x-axis is the horizontal direction of the image, and the y-axis is the vertical direction of the image. Further, the z-axis is the thickness direction of an array substrate to be described later.

Figure 1:
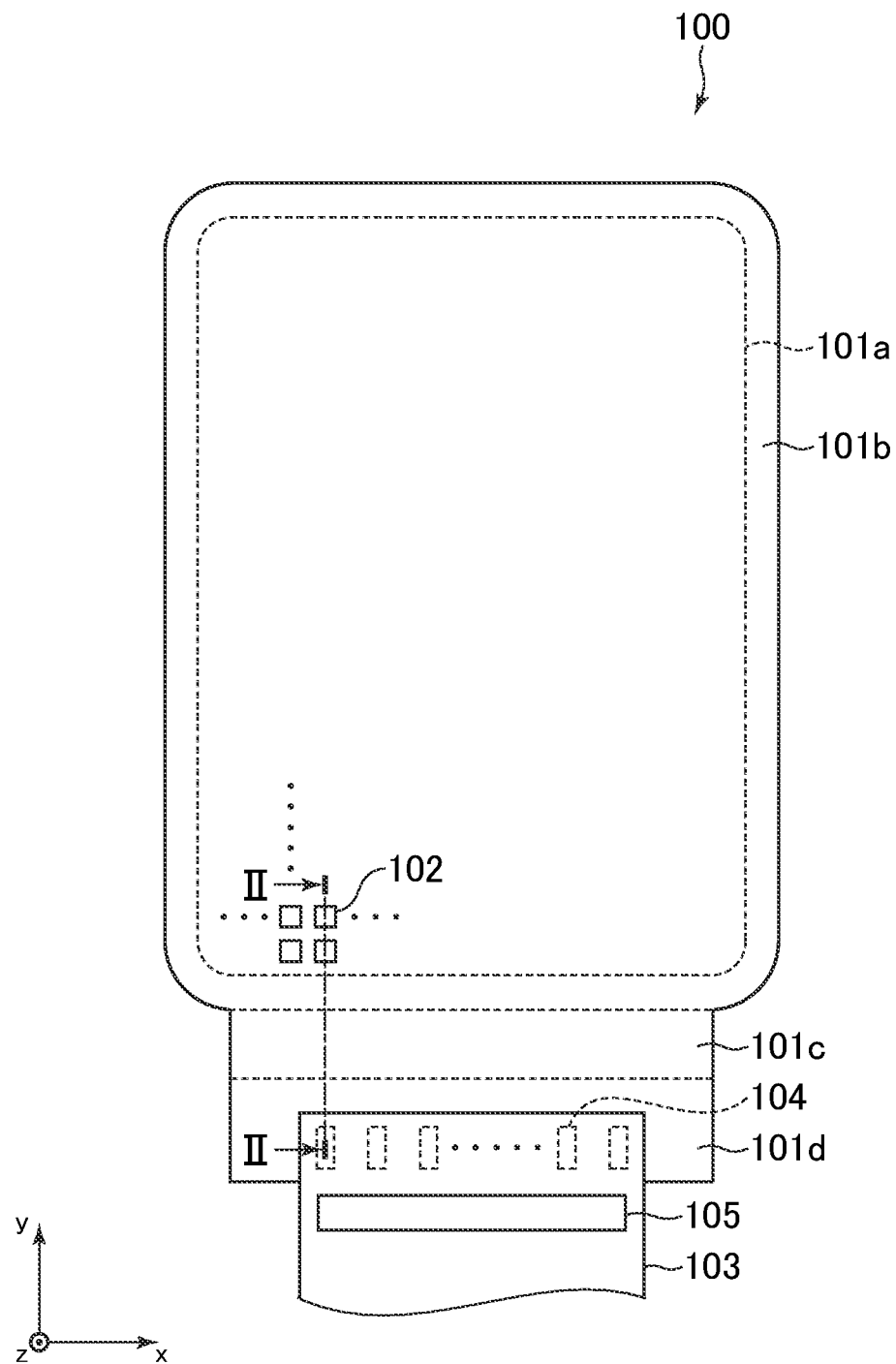
FIG. 1 is a schematic plan view of a display device according to an embodiment of the present invention.

FIG. 1 is a schematic plan view of a display device 100 according to the present embodiment. The display device 100 is a display panel formed using a flexible substrate, and includes a display area 101a, a peripheral area 101b, a bending area 101c, and a terminal area 101d.

The display area 101a is an area for displaying an image. The display area 101a has a substantially rectangular shape, and in this embodiment, has a rectangular shape with four corners chamfered in an arc shape. Correspondingly, the planar shape of the display panel also has a substantially rectangular chamfered shape as shown in FIG. 1. In the display area 101a, a plurality of pixels 102 are arranged in a matrix along the x-direction and the y-direction. Each of the pixels 102 is provided with an OLED.

The peripheral area 101b is in contact with the periphery of the display area 101a and surrounds the display area 101a. A driving circuit for controlling light emission of the pixels 102 may be disposed in the peripheral area 101b.

The bending area 101c is an area provided for bending the display device 100, and is provided between the peripheral area 101b and the terminal area 101d on one side of the display device 100. By bending the display device 100 at the bending area 101c, the terminal area 101d can be folded on the back side of the display surface of the display area 101a.

The terminal area 101d is an area for connecting the display device 100 and the flexible printed circuit board (FPC board) 103, for example, and is provided on one side of the display device 100. Specifically, a group of wires drawn from the display area 101a and the peripheral area 101b is disposed in the terminal area 101d. A connection terminal 104 for connecting the group of wires to an external circuit is disposed in the terminal area 101d. For example, the FPC board 103 is connected to the connection terminal 104. The FPC board 103 is connected to a circuit of a control device, or includes an IC 105 mounted thereon, for example.

Figure 2:
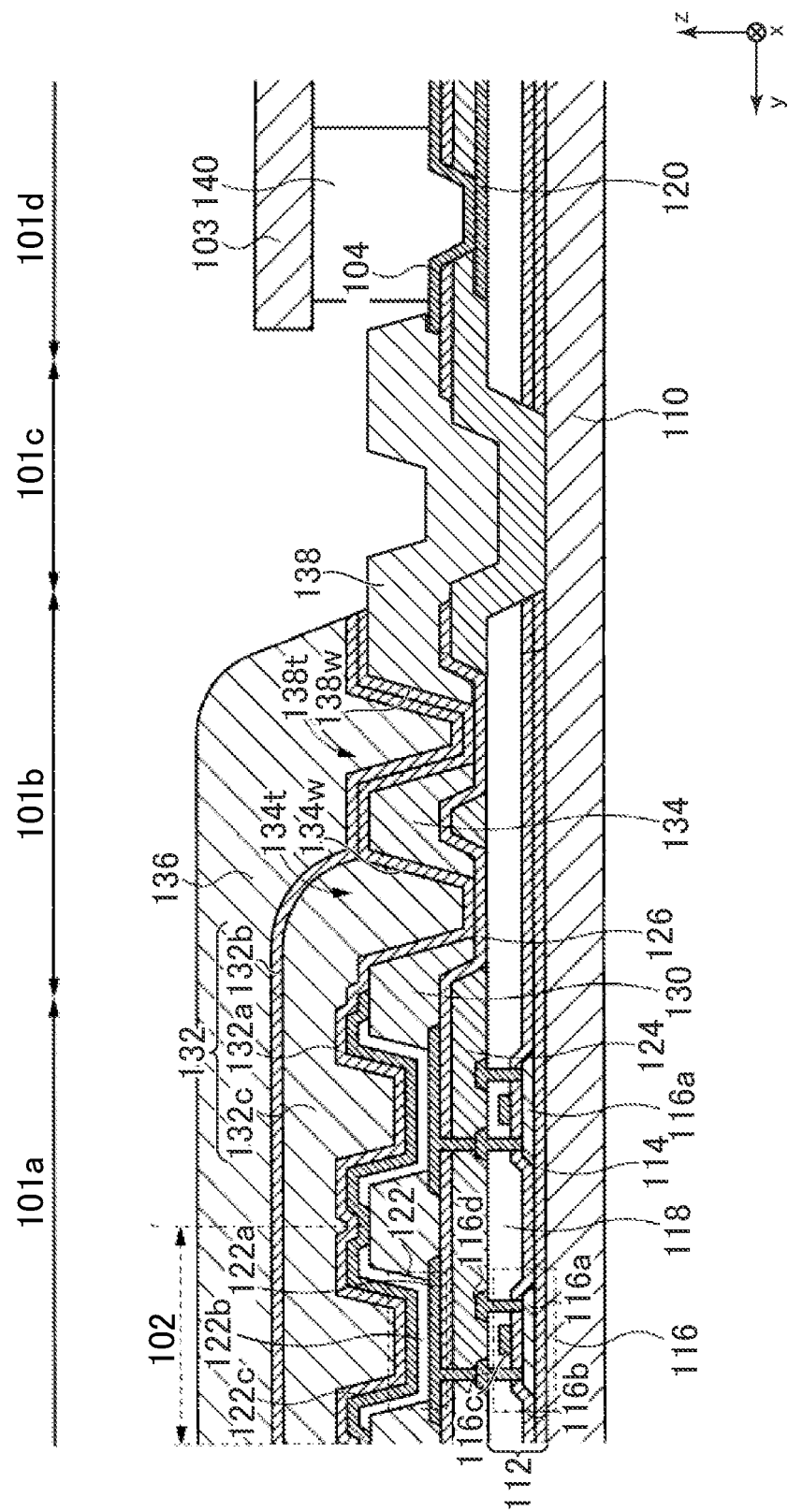
FIG. 2 is a schematic vertical sectional view of the display device according to an embodiment of the present invention.

FIG. 2 is a schematic vertical sectional view of the display device 100 taken along the line II-II shown in FIG. 1 according to the present embodiment.

A substrate 110 supports a circuit layer 112 and various elements such as a plurality of pixels 102 disposed on one surface thereof. The substrate 110 is formed of, for example, a flexible insulating material. Specifically, a polymer material such as polyimide, polyamide, polyester, and polycarbonate may be used as a material of the substrate 110. The substrate 110 may also be formed of a material such as glass, quartz, plastic, metal, and ceramic.

The circuit layer 112 is provided on one surface of the substrate 110, and includes an undercoat layer 114, a TFT 116, and an interlayer insulating film 118. A pixel circuit including the TFT 116 and a drive circuit (not shown) are provided on the circuit layer 112. The pixel circuits are respectively provided in the pixels 102 arranged in the display area 101a, and control light emission of the OLED 122. The drive circuit is provided in the peripheral area 101b to drive the pixel circuits.

The undercoat layer 114 is disposed on one surface of the substrate 110, and serves as a barrier against impurities contained in the substrate 110. The undercoat layer 114 is made of, for example, a silicon oxide film and a silicon nitride film, and may be a laminated structure of these films.

The TFT 116 includes a semiconductor layer 116a, a gate insulating film 116b, a gate electrode 116c, a source/drain (S/D) electrode 116d, for example. The semiconductor layer 116a is laminated on the undercoat layer 114, and forms a channel region, a source region, and a drain region of the TFT 116. After the semiconductor layer 116a is formed, the gate insulating film 116b is formed of a material such as silicon oxide, and a metal film laminated thereon is patterned to form the gate electrode 116c of the TFT, for example.

An inorganic film covers the gate electrode 116c, for example, to serve as the interlayer insulating film 118. The inorganic insulating material is liable to generate defects, such as cracks, due to bending. This can be a starting point of an intrusion path of moisture. As such, the undercoat layer 114, the gate insulating film 116b, and the interlayer insulating film 118 are removed from the bending area 101c by etching, for example.

Thereafter, a metal film is formed on the surface of the substrate, and is used to form the S/D electrode 116d of the TFT on the interlayer insulating film 118. The S/D electrode 116d is electrically connected to the semiconductor layer 116a of the TFT through a contact hole penetrating the gate insulating film 116b and the interlayer insulating film 118.

Further, wiring may be formed using the metal film, and for example, terminal wiring 120 of the terminal area 101*d* is formed.

A flattening insulating layer 124 made of an organic material is disposed so as to cover the interlayer insulating film 118 and the S/D electrodes 116*d* formed on the interlayer insulating film 118. An organic insulating material such as polyimide, epoxy resin, and acrylic resin may be used as the flattening insulating layer 124. The flattening insulating layer 124 flattens the surface on which the OLED 122 is formed.

An inorganic film 126 is formed on the flattening insulating layer 124 so as to protect the OLED 122 from moisture penetrating from the flattening insulating layer 124. The inorganic film 126 is formed of a material with moisture-proof and insulating properties. For example, the inorganic film 126 is formed of a silicon nitride film or a laminated film of a silicon nitride film and a silicon oxide film. The inorganic film 126 formed on the flattening insulating layer 124 in the bending area 101*c* is removed so as to prevent the cracking described above.

In the display area 101*a*, a pixel electrode 122*a* of the OLED 122 is disposed on the surface of the inorganic film 126. The pixel electrode 122*a* is electrically connected to the S/D electrode 116*d* of the TFT 116 through a contact hole penetrating the inorganic film 126 and the flattening insulating layer 124. The pixel electrode 122*a* may include a reflective film that reflects light emitted from the OLED toward the display surface. For example, the pixel electrodes 122*a* may have a laminate structure of a transparent conductive material, such as indium tin oxide (ITO) and indium zinc oxide (IZO), and a reflective material, such as silver (Ag).

A bank 130 made of an insulating material is formed on the surface of the inorganic film 126 on which the pixel electrode 122*a* is formed. The bank 130 is formed along the periphery of the pixels, covers the end portion of the pixel electrode 122*a*, and have an opening at the position of the light emitting surface of the OLED. The upper surface of the pixel electrode 122*a* is exposed from the bottom of the opening, and an organic material layer 122*b*, which is an organic layer including a light emitting layer, is laminated on the surface thereof. The bank 130 is formed of an organic insulating material, such as polyimide, epoxy resin, and acrylic resin.

A counter electrode 122*c* of the OLED is formed on the organic material layer 122*b*. While the pixel electrode 122*a* is a separate electrode for each pixel, the counter electrode 122*c* may be a common electrode extending over the entire pixels of the display area 101*a*. The counter electrode 122*c* is formed of a material that transmits light emitted from the organic material layer 122*b*. Specifically, the counter electrode 122*c* is a thin film made of a semi-transparent metal having a low work function so that electrons can be efficiently injected into the organic material layer 122*b*, and made of, for example, a MgAg alloy.

A sealing film 132 is formed in the display area 101*a* where the OLED 122 including the pixel electrode 122*a*, the organic material layer 122*b*, and the counter electrode 122*c* is formed so as to seal the upper surface of the OLED 122 and prevent deterioration of the OLED 122 due to moisture. The area where the sealing film 132 is formed includes the display area 101*a*, and the end portion is located in the peripheral area 101*b*. In the present embodiment, the sealing film 132 has a multilayer structure including two inorganic films 132*a* and 132*b* and an organic film 132*c*, and the organic film 132*c* is sandwiched between the inorganic film 132*a* and the inorganic film 132*b* in the display area 101*a*.

The sealing film 132 is a flattening sealing film described above, and the inorganic films 132*a* and 132*b* mainly serve to block moisture intrusion into the OLED 122, while the organic film 132*c* mainly serves a function of flattening. As such, the inorganic films 132*a* and 132*b* are preferably formed of an insulating material having a low moisture permeability, such as a silicon nitride film. On the other hand, the organic film 132*c* is formed of a resin such as acrylic.

The inorganic film 132*a* is laminated on the surface of the counter electrode 122*c* in the display area 101*a*. The inorganic film 132*a* has an uneven surface due to the bank 130 that the inorganic film 132*a* covers. The organic film 132*c* is laminated on the inorganic film 132*a* to flatten the unevenness. The inorganic film 132*b* is laminated on the organic film 132*c*. The surface of the organic film 132*c* is thus flattened, which reduces the unevenness of the inorganic film 132*b* so that a defect of the inorganic film 132*b* due to cracks at the uneven portion is less likely to occur.

The organic film 132*c* is formed by an ink jet method. That is, a method of manufacturing the organic film 132*c* includes a step of dropping liquid resin material by the ink jet method and applying the liquid resin material on the substrate. Further, the manufacturing method may include a step of curing the applied resin material with heat and ultraviolet rays, for example.

A first dam portion 134 is formed in the peripheral area 101*b* along the edge of the area where the organic film 132*c* is to be formed. The dam portion 134 includes a wall surface 134*w* facing the display area 101*a*, and blocks the liquid resin material of the organic film 132*c* dropped to the display area 101*a*. For example, the dam portion 134 may be formed of a layer forming the bank 130. In this case, a groove portion 134*t* is formed between the bank 130 located at the outermost part in the display area 101*a* and the dam portion 134. The groove 134*t* is basically disposed so as to surround the display area 101*a*.

As described above, the inorganic film 132*a* is formed so as to cover the counter electrode 122*c* in the display area 101*a*, and reaches the dam portion 134 provided in the peripheral area 101*b*. In the example shown in FIG. 2, the inorganic film 132*a* extends to the boundary between the peripheral area 101*b* and the bending area 101*c*. The dam portion 134 has a height that is not flattened by the inorganic film 132*a*.

After the inorganic film 132*a* is formed, the organic film 132*c* is formed. The dam portion 134 described above allows the end portion of the organic film 132*c* to be basically positioned within the wall surface 134*w* of the dam portion 134 on the display area 101*a* side or the upper surface of the dam portion 134.

The inorganic film 132*b* is formed in an area including the organic film 132*c*, and the inorganic films 132*a* and 132*b* cover the organic film 132*c*. In the example shown in FIG. 2, similarly to the inorganic film 132*a*, the inorganic film 132*b* extends to the boundary between the peripheral area 101*b* and the bending area 101*c*. The inorganic film 132*a* and the inorganic film 132*b* have a contact area outside the organic film 132*c* where the inorganic film 132*a* and the inorganic film 132*b* are directly contacted and overlapped with each other. The inorganic films 132*a* and 132*b* are bonded in the contact area, thereby preventing moisture intrusion into the organic film 132*c*.

If the organic film 132*c* spreads excessively, the contact area of the inorganic films 132*a* and 132*b* may not be provided and moisture may infiltrate. However, the dam portion 134 blocks the organic film 132c so as to prevent such defect.

A protective layer 136 is laminated on the inorganic film 132b. The protective layer 136 is an organic film made of a transparent resin and functions to protect the display area 101a. Further, the protective layer 136 is used as a mask when etching and removing the inorganic films 132a and 132b of the sealing film 132 covering the connection terminal 104. That is, the inorganic films 132a and 132b are also laminated on the above-described bending area 101c and the terminal area 101d, but then removed from the bending area 101c and the terminal area 101d by etching processing using the protective layer 136 formed in the display area 101a and the peripheral area 101b as an etching mask. As a result, the positions of the ends of the inorganic films 132a and 132b are aligned with the end of the protective layer 136. The contact area of the inorganic films 132a and 132b are provided at the edge of the sealing film 132, and thus the protective layer 136 extends outward of the first dam portion 134.

Similarly to the organic film 132c, the protective layer 136 is basically formed by a manufacturing method using the ink jet method. In the same way that the first dam portion 134 is provided on the organic film 132c, a second dam portion 138 is provided on the protective layer 136. That is, the second dam portion 138 is formed in the peripheral area 101b along the edge of the area where the protective layer 136 is to be formed. The dam portion 138 includes a wall surface 138w facing the display area 101a, and blocks the liquid resin material of the protective layer 136 dropped to the inner area of the dam portion 138. For example, the dam portion 138 may be made of the layer forming the bank 130 and the dam portion 134. In this case, a groove 138t is formed between the first dam portion 134 and the second dam portion 138. The groove 138t is basically disposed so as to surround the display area 101a.

The end portion of the protective layer 136 is retracted by etching the inorganic films 132a and 132b when exposing the connection terminal 104. If the amount of retraction is too large, for example, the inorganic film 132b in contact with the organic film 132c is etched in the sealing film 132 to expose the organic film 132c, and the OLED 122 deteriorates due to moisture entering therefrom. This increases the risk of dark spots to occur. In this regard, the dam portion 138 serves to increase the thickness of the end portion of the protective layer 136 by the groove 138t, and thus the amount of retraction of the end portion at the time of etching can be reduced.

If the resin of the protective layer 136 spreads beyond the bending area 101c, the above described problem may occur in which the inorganic films 132a and 132b remain in the bending area 101c at the time of the etching using the protective layer 136 as a mask and a defect of an inorganic film, such as a crack generated by bending, may be developed into an intrusion path of moisture. Further, the exposure of the connection terminal 104 may be inhibited. In this regard, the dam portion 138 may block the resin of the protective layer 136 and prevent these inconveniences.

In order to assure the functions of the dam portions 134 and 138, for example, the width of the grooves 134t and 138t may preferably be 10 μm or more and the height of the dam portions 134 and 138 may preferably be 1 μm or more. In view of the processing method for forming the dam portions 134 and 138, the width of the dam portions 134 and 138 is preferably 5 μm or more in order to form the dam portions 134 and 138 having a sufficient height. These dimensions may be limited from other perspectives. For example, the widths of the dam portions 134 and 138 and the groove portions 134t and 138t are preferably small so as to narrow the frame.

In the terminal area 101d, the connection terminal 104 is electrically connected to the terminal wiring 120 through a contact hole penetrating the inorganic film 126 and the flattening insulating layer 124. The connection terminal 104 is connected to the FPC board 103 by, for example, an anisotropic conductive film 140.

Figure 3:
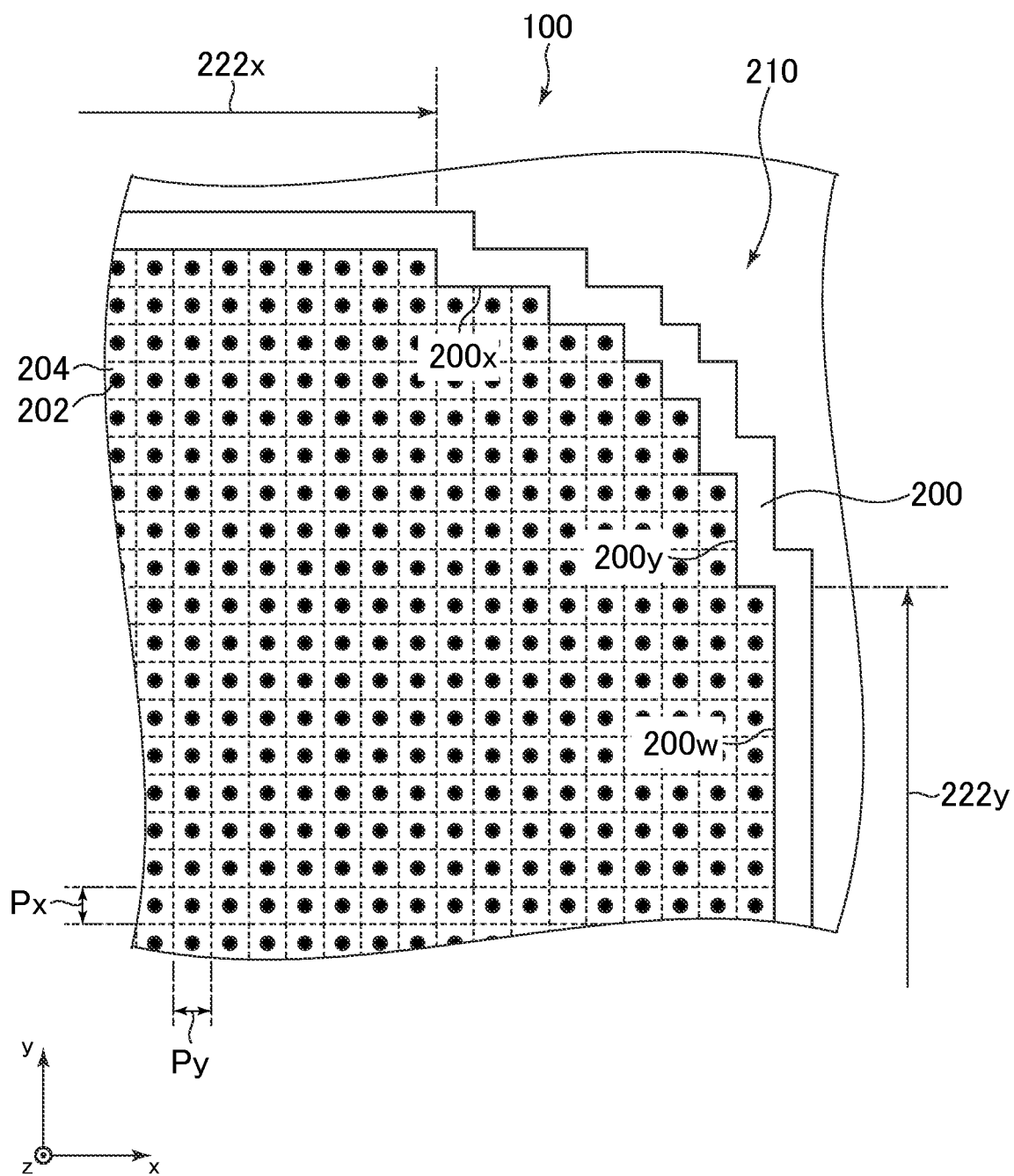
FIG. 3 is a schematic partial plan view of the display device according to an embodiment of the present invention.
Figure 5:
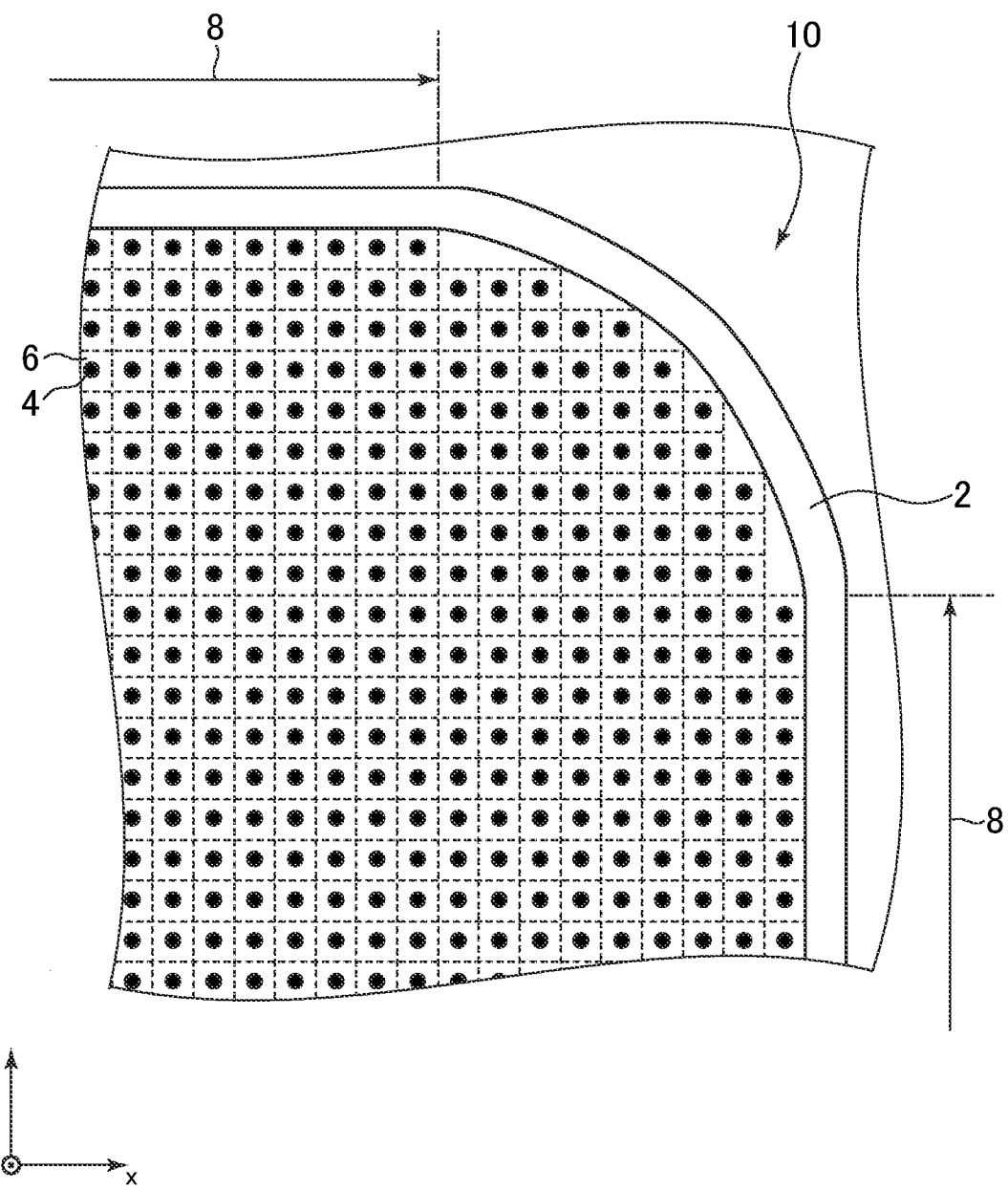
FIG. 5 is a schematic partial plan view of a conventional display device.

FIG. 3 is a schematic partial plan view of the display device 100. FIG. 3 shows the dropping positions of the organic film 132c or the protective layer 136 by the ink jet method of the resin and the layout of the dam portion with respect to the resin, and shows the characteristics of the display device of the present invention compared with the conventional display device shown in FIG. 5. Specifically, the dam portion 200 shown in FIG. 3 is the first dam portion 134 or the second dam portion 138 described above. When the dam portion 200 is the first dam portion 134, dropping positions 202 are dropping positions of the resin of the organic film 132c, and when the dam portion 200 is the second dam portion 138, the dropping positions 202 are dropping positions of the resin of the protective layer 136.

The organic film 132c and the protective layer 136 are formed in a substantially rectangular planar shape. Here, the substantially rectangular shape is a rectangle having a side along the first direction and a side along the second direction perpendicular to the first direction, where the rectangular shape having a deformed portion forming an outline inclined to the first and second directions. For example, the deformed portion is a chamfered portion provided in at least one corner of the rectangle. In the present embodiment, as described above, the display area 101a has a substantially rectangular shape with each corner of the rectangle as a chamfered portion, and correspondingly, the organic film 132c and the protective layer 136 have a substantially rectangular shape, in which the first direction and the second direction are the x-direction and the y-direction, respectively, with each corner of the rectangle as a chamfered portion. The partial plan view of FIG. 3 shows the chamfered portion 210 at one of the corners of the substantially rectangular shape and its vicinity.

Figure 4:
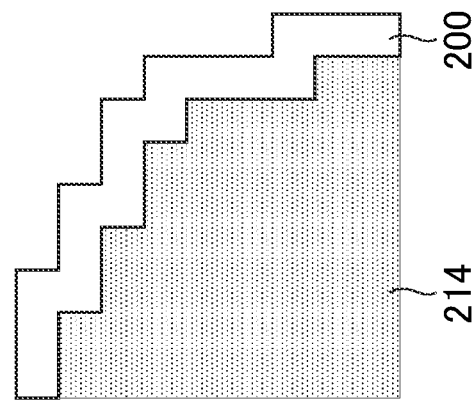
FIG. 4 is a schematic plan view showing a process in which dropped resin materials spread along a substrate surface.
Figure 4:
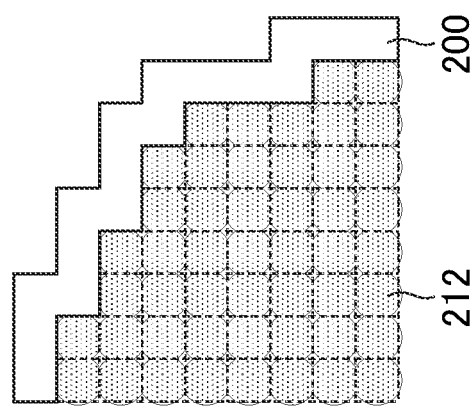
Figure 4:
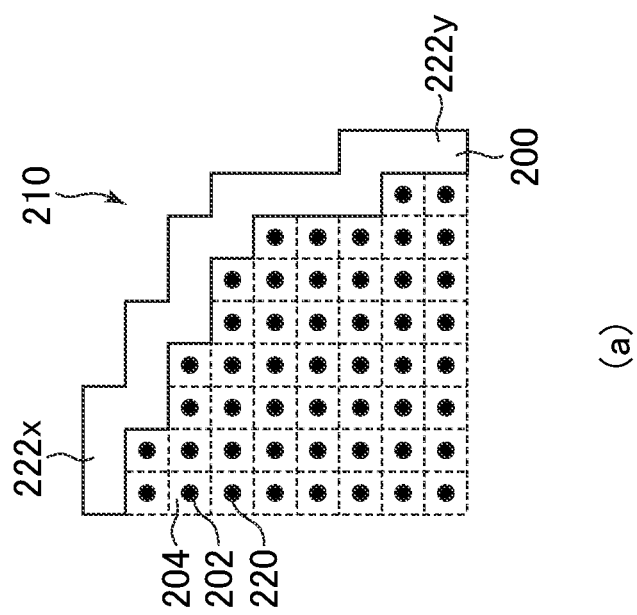

The ink jet printer controls the dropping positions 202 in units of grids 204 arranged two-dimensionally at a predetermined pitch in the x-direction and the y-direction, and forms a substantially rectangular resin film. Specifically, the ink jet printer discharges liquid resin material in a dot form to the dropping positions 202, and the discharged resin material spreads along the substrate surface to form a resin film. FIG. 4 is a schematic plan view showing a process in which the dropped resin material spreads along the substrate surface, and the dots 220 in FIG. 4(a) show the resin material immediately after being dropped. The resin material spreads and adjacent dots 220 are connected to each other. FIG. 4(b) shows such a state where the resins 212 are connected between adjacent dropping positions, while a portion that is not yet covered with the resin 212 remains on the substrate surface. As shown in FIG. 4(C), as the resin further spreads, the entire substrate surface inside the dam portion 200 is covered with the resin film 214.

Here, the dropping position 202 is controlled with the grid 204 as a unit, and thus, the inclined outline of the above-described deformed portion can have an uneven shape corresponding to the scale of the grid 204. Correspondingly, the wall surface 200w of the dam portion 200 facing the display area 101a, that is, the wall surfaces 134w and 138w of the dam portions 134 and 138 are also formed in a zigzag pattern at the deformed portion. Specifically, the wall surface 200w basically includes a plurality of first partial wall surfaces 200x along the x-direction and a plurality of second partial wall surfaces 200y along the y-direction, and, at least in the substantially rectangular deformed portion, the first partial wall surfaces 200x have a length that is an integer multiple of the first unit length, and the second partial wall surfaces 200y have a length that is an integer multiple of the second unit length. In the substantially rectangular deformed portion, the first partial wall surfaces 200x and the second partial wall surfaces 200y are alternately connected in a zigzag manner. That is, when the planar shape of the wall surface 200w is traced along the wall surface 200w, the wall surface 200w is alternately bent in the opposite direction in the deformed portion, and arranged along the outline of the arrangement of the grids 204.

The first unit length and second unit length are determined in accordance with the dropping pitch of the resin of the ink jet in the x-direction and the y-direction, respectively. Specifically, the first unit length may be an interval Px in the x-direction of the dropping positions 202, and the second unit length may be an interval Py in the y-direction of the dropping positions 202. Px and Py are basically determined according to an ink jet printer used for forming the organic film 132c and the protective layer 136, and are, for example, several tens of micrometers. For example, Px and Py may be set to a common value. The distance between the edge of the two-dimensional arrangement of the dropping positions 202 and the wall surface 200w is basically constant, and thus a change in the thickness t of the resin film 214 along the wall surface 200w of the dam portion is reduced. For example, the minimum value of the thickness t along the wall surface 200w may be set to ½ or more of the maximum value.

As described above, the wall surface 200w of the dam portion 200 is arranged along the outline of the grids 204. Specifically, the partial wall surfaces 200x extending in the x-direction are disposed in the portions of the outline of the grids 204 along the x-direction, and the partial wall surfaces 200y extending in the y-direction are disposed in the portions of the outline of the grids 204 along the y-direction. The distance (dy) between the outline and each partial wall surface 200x may be basically common, and similarly, the distance (dx) between the outline and each partial wall 200y may be basically common. Further, dy and dx may basically be set to the same distance.

Specifically, as shown in FIG. 4(c), the distances dx and dy may be respectively smaller than Px and Py in order to reduce the difference in thickness between the end portion of the spread resin film 214 and the inner area, in other words, to make the resin film 214 reach the wall surface 200w with a sufficient thickness. For example, dx and dy are set to 0 in FIGS. 3 and 4.

As described above, the chamfered portion of the display area 101a is an arc that is outwardly convex. Correspondingly, in the present embodiment, as shown in FIGS. 3 and 4, the schematic planar shape of the chamfered portion 210, which is the deformed portion having a substantially rectangular shape, is also an arc that is outwardly convex. Specifically, the planar shape of the chamfered portion 210 has a zigzag shape as described above, and the wall surface 200w of the chamfered portion 210 is composed of a row of partial wall surfaces connected in a zigzag manner.

In the row of partial wall surfaces forming the wall surface 200w of the chamfered portion 210, the lengths of the first partial wall surfaces 200x decrease in a broad monotonic manner, while the lengths of the second partial wall surfaces 200y increase in a broad monotonic manner, in the order from the side 222x in the x-direction to the side 222y in the y-direction of the two sides of the substantially rectangular shape adjacent to the chamfered portion 210. Specifically, in the example of FIG. 3, the lengths of the first partial wall surfaces 200x that appear when the wall surface 200w of the chamfered portion 210 is traced from the side 222x to the side 222y are 3, 2, 1, 1, 1, 1, 1, in order in a unit of Px, and the lengths of the second partial wall surfaces 200y are 1, 1, 1, 2, 3, in order in a unit of Py.

In the above embodiment, the example is described in which the substantially rectangular deformed portion is the chamfered portion 210 provided at a corner of the rectangle. However, the deformed portion is not limited to the corner of the rectangle, that is, the end portion of the side 222x of the substantially rectangular shape in the x-direction or the end portion of the side 222y in the y-direction, and may be positioned halfway between the sides 222x and 222y of the substantially rectangular shape.

The present invention is not limited to the embodiment described above, and various modifications can be made. For example, the configurations described in the embodiment can be replaced by substantially the same configurations, configurations that exhibit the same operational effect, or configurations that can achieve the same object.

The invention claimed is:

1. A display device comprising:
a substrate including a display area in which a plurality of pixels are arranged;
an organic film having a substantially rectangular planar shape and covering the display area; and
a dam portion including a wall surface that is positioned along an edge of the organic film and faces the display area, wherein
the substantially rectangular shape is a rectangle that includes a side along a first direction and a side along a second direction perpendicular to the first direction and includes a deformed portion forming an outline inclined to the first and second directions,
the wall surface includes a plurality of first partial wall surfaces along the first direction and a plurality of second partial wall surfaces along the second direction,
the plurality of first partial wall surfaces have a length that is an integer multiple of a first unit length, and the plurality of second partial wall surfaces have a length that is an integer multiple of a second unit length,
in the deformed portion of the substantially rectangular shape, the first partial wall surfaces and the second partial wall surfaces are connected in a zigzag manner,
the deformed portion is a chamfered portion provided on at least one of corners of the rectangle, and
in a case where a substantially planar shape of the chamfered portion is an outwardly convex arc, in an order from a side in the first direction to a side in the second direction of two sides of the substantially rectangular shape adjacent to the chamfered portion, lengths of the first partial wall surfaces decrease in a broad monotonic manner, while lengths of the second partial wall surfaces increase in a broad monotonic manner, the first partial wall surfaces and the second partial wall surfaces forming the wall surface of the chamfered portion.

2. The display device according to claim 1, further comprising:
a light-emitting element including a light emitting layer and arranged in the display area, the light emitting layer being made of an organic material;

a first organic film on the light-emitting element,
a first dam portion along an edge of the first organic film; and
two inorganic films, one being provided between the light-emitting element and the first organic film and another being provided on the first organic film, being in contact with each other outside the edge of the first organic film to cover the first organic film.

3. The display device according to claim 2, further comprising:
a second organic film disposed on the first organic film and the inorganic film and extending outward of the first dam portion; and
a second dam portion along an edge of the second organic film.

4. The display device according to claim 2, wherein
in a change of a thickness of the organic film along the wall surface of the dam portion, a minimum thickness is ½ or more of a maximum thickness.

5. The display device according to claim 2, wherein the first unit length is equal to the second unit length.

6. The display device according to claim 1, wherein
in a change of a thickness of the organic film along the wall surface of the dam portion, a minimum thickness is ½ or more of a maximum thickness.

7. The display device according to claim 6, wherein the first unit length is equal to the second unit length.

8. The display device according to claim 1, wherein the first unit length is equal to the second unit length.

9. A manufacturing method of a display device, the display device comprising;
a substrate including a display area in which a plurality of pixels are arranged;
an organic film having a substantially rectangular planar shape and covering the display area; and
a dam portion including a wall surface that is positioned along an edge of the organic film and faces the display area, wherein
the substantially rectangular shape is a rectangle that includes a side along a first direction and a side along a second direction perpendicular to the first direction and includes a deformed portion forming an outline inclined to the first and second directions,
the wall surface includes a plurality of first partial wall surfaces along the first direction and a plurality of second partial wall surfaces along the second direction,
the plurality of first partial wall surfaces have a length that is an integer multiple of a first unit length, and the plurality of second partial wall surfaces have a length that is an integer multiple of a second unit length, and
in the deformed portion of the substantially rectangular shape, the first partial wall surfaces and the second partial wall surfaces are connected in a zigzag manner, the method comprising:
dropping the organic film by an ink jet method to apply the organic film to the substrate, wherein
the first unit length and the second unit length are respectively determined in accordance with a dropping pitch of ink jet in the first direction and with a dropping pitch of ink jet in the second direction.

* * * * *